(12) United States Patent
Lee

(10) Patent No.: US 7,316,957 B2
(45) Date of Patent: Jan. 8, 2008

(54) SEMICONDUCTOR DEVICE AND METHOD FOR MANUFACTURING THE SAME

(75) Inventor: Dong Joon Lee, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 85 days.

(21) Appl. No.: 11/317,890

(22) Filed: Dec. 27, 2005

(65) Prior Publication Data

US 2006/0202262 A1    Sep. 14, 2006

(30) Foreign Application Priority Data

Dec. 27, 2004  (KR)  ............... 10-2004-0112915

(51) Int. Cl.
*H01L 21/336* (2006.01)
(52) U.S. Cl. .................. 438/294; 438/218; 438/301; 438/305; 257/344; 257/E21.573; 257/E21.581; 257/E21.564
(58) Field of Classification Search .......... 438/218, 438/294; 257/E21.573, E21.581, E21.564, 257/E21.628, E21.552, E29.051, E29.276, 257/344
See application file for complete search history.

(56) References Cited

U.S. PATENT DOCUMENTS 6,110,790 A * 8/2000 Chen .................. 438/305

6,174,754 B1 * 1/2001 Lee et al. .............. 438/142

FOREIGN PATENT DOCUMENTS

JP    04357876    10/1992
JP    05243570    9/1993

* cited by examiner

*Primary Examiner*—Long K. Tran
(74) *Attorney, Agent, or Firm*—McKenna Long & Aldridge LLP

(57) ABSTRACT

A semiconductor device and a method for manufacturing the same are provided. A gate insulating film is formed under a vacuum condition to prevent deterioration of reliability of the device due to degradation of a gate insulating material and to have stable operating characteristics. The semiconductor device includes an element isolating film formed at element isolating regions of a semiconductor substrate, which is divided into active regions and the element isolating regions; a gate insulating film having openings with a designated width formed at the active regions of the semiconductor substrate; gate electrodes formed on the gate insulating film; and lightly doped drain regions and source/drain impurity regions formed in the surface of the semiconductor substrate at both sides of the gate electrodes.

11 Claims, 5 Drawing Sheets

SEMICONDUCTOR DEVICE AND METHOD FOR MANUFACTURING THE SAME

CROSS REFERENCE TO RELATED APPLICATIONS

This application claims the benefit of Korean Patent Application No. 10-2004-0112915, filed on Dec. 27, 2004, which is hereby incorporated by reference as if fully set forth herein.

BACKGROUND OF THE INVENTION

1. Field of the Invention

The present invention relates to a semiconductor device, and more particularly to a semiconductor device and method for manufacturing the same that does not result in poor reliability due to degradation of a gate insulating material and that has stable operating characteristics.

2. Discussion of the Related Art

In a semiconductor device manufacturing process, an insulating film may serve as a surface passivation layer for shielding external impurities, as an ion implantation mask, and as an insulating film for a silicon substrate. Such insulating films greatly influence the yield of semiconductor devices. For example, with an electrical conduction channel (between source and drain) formed on a semiconductor substrate, a gate insulating film, which is used to maintain an electrical charge, has a minimum thickness for high-speed operation of a semiconductor device to maximize integration. The gate insulating film is formed on a surface of the semiconductor substrate as a thermal oxide film, i.e., by thermally oxidizing the semiconductor substrate, which is used as the gate insulating film because of its reactivity with the semiconductor substrate, carrier mobility, and interface roughness.

FIGS. 1A-1C, showing a typical semiconductor device, illustrate a conventional process for forming a gate insulating film.

As shown in FIG. 1A, an isolating film 11 is formed on a semiconductor substrate 10 having active regions and isolating regions. In this case, the isolating film 11 is formed at the isolating regions. Thereafter, a gate oxide film 12 is grown on the active regions of the semiconductor substrate 10 by performing thermal oxidation of the semiconductor substrate 10 at a high temperature. An annealing process using NO or $N_2O$ gas at a temperature higher than the growth temperature of the gate oxide film 12 is then performed on the gate oxide film 12.

As shown in FIG. 1B, a polysilicon layer is deposited on the gate oxide film 12, and is selectively etched by photolithography processes, thereby forming gate electrode 13. Thereafter, low-concentration impurity ions are implanted into the surface of the semiconductor substrate 10 at both sides of the gate electrode 13, thereby forming lightly doped drain regions 14.

As shown in FIG. 1C, an insulating film is deposited on the overall surface of the semiconductor substrate 10. Insulating film side walls 15 are formed on side surfaces of the gate electrodes 13 by an etch back process performed on the insulating film, and source/drain impurity regions 16 are formed by implanting high-concentration impurity ions into the overall surface of the semiconductor substrate 10 using the gate electrodes 13 and the insulating film side walls 15 as a mask.

In a typical method for manufacturing the semiconductor device the gate oxide film 12 is formed by thermally oxidizing the semiconductor substrate 10. The insulating characteristics of oxide film 12 are heavily dependent on the characteristics of the film. Accordingly, undesired dielectric breakdown may occur in some circumstances.

The above conventional method has several problems. For example, as the gate insulating film becomes gradually thinner, so as to form a device having a small line width, low power, and high performance, leakage current increases due to direct tunneling, thus obstructing the implementation of stable characteristics of the device. This is especially true when the $SiO_2$ film is less than approximately 2.3 nm. In addition, as the $SiO_2$ film is less than approximately 2.5 nm, it is difficult to perform an etching process of the gate electrodes, and PMOS gates, into which boron is implanted, have an unstable threshold voltage due to the implantation of boron.

Furthermore, as the boron present in a polysilicon layer is implanted into an oxide film during a subsequent thermal process, it deteriorates breakdown voltage of the gate insulating film.

SUMMARY OF THE INVENTION

Accordingly, the present invention is directed to a semiconductor device and a method for manufacturing the same that obviates one or more of the problems due to limitations and disadvantages of the related art.

One advantage of the present invention is that it can provide a gate insulating film formed under a vacuum condition to prevent deterioration in reliability of the device due to degradation of a gate insulating material and to have stable operating characteristics.

Additional advantages, and features of the invention will be set forth in part in the description which follows and in part will become apparent to those having ordinary skill in the art upon examination of the following.

To achieve these and other advantages in accordance with the purpose of the invention, as embodied and broadly described herein, a semiconductor device comprises an isolating film formed at isolating regions of a semiconductor substrate, which is divided into active regions and the isolating regions; a gate insulating film having openings with a predetermined width formed at the active regions of the semiconductor substrate; gate electrodes formed on the gate insulating film; and lightly doped drain regions and source/drain impurity regions formed in the surface of the semiconductor substrate at both sides of the gate electrodes.

In another aspect of the present invention, a method for manufacturing a semiconductor device comprises forming an insulating film on a semiconductor substrate; forming openings having a designated width by selectively etching the insulating film; attaching a conductive film to the overall surface of the semiconductor substrate including the openings under a vacuum condition; forming gate electrodes corresponding to the openings and having a width larger than the width of the openings by selectively etching the conductive film and the insulating film; forming lightly doped drain regions and source/drain impurity regions in the surface of the semiconductor substrate at both sides of the gate electrodes; forming a mask layer covering portions of the semiconductor substrate having the source/drain impurity regions including the gate electrodes; forming trenches by selectively etching exposed portions of the semiconductor substrate using the mask layer as a mask; and forming an element isolating film in the trenches and on the semiconductor substrate adjacent the trenches.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention.

In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1A:
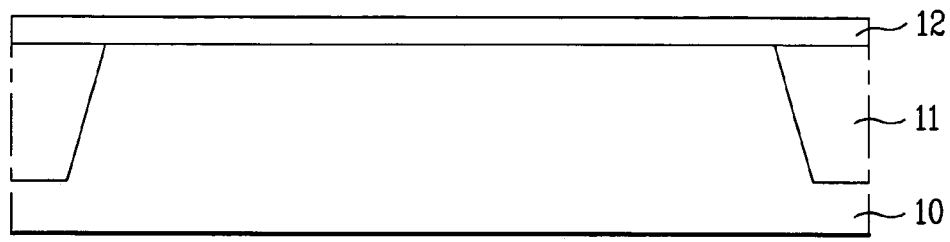
FIGS. 1A-1C are sectional views of a typical semiconductor device manufactured by a method according to the related art.
Figure 1B:
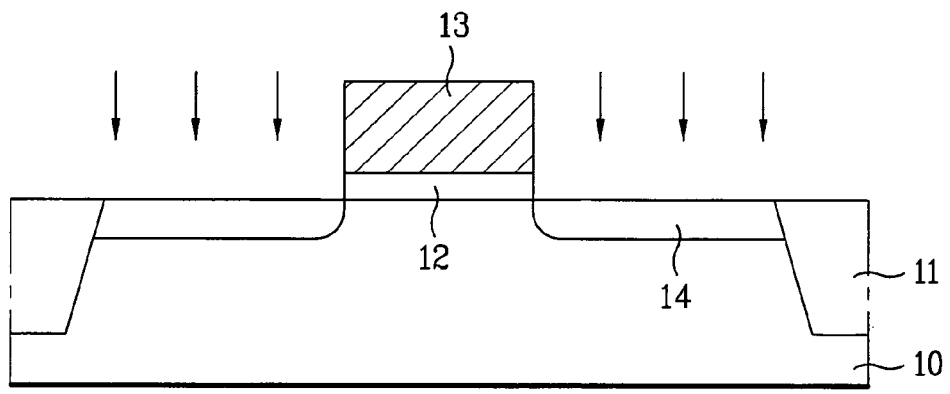
Figure 1C:
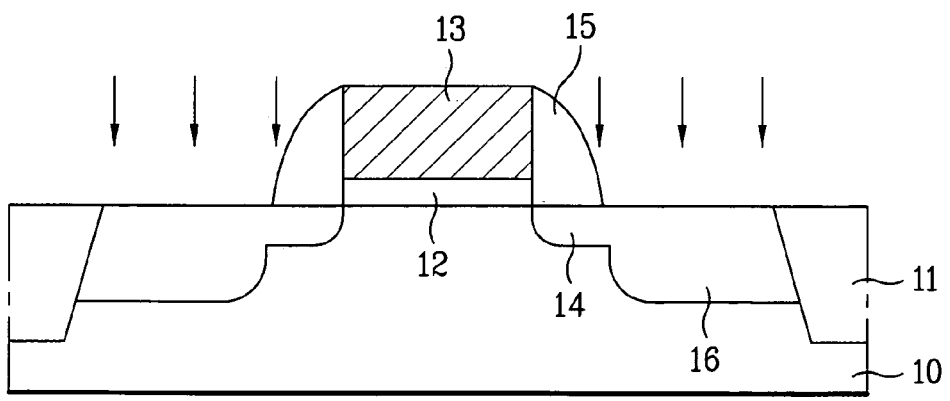
Figure 2:
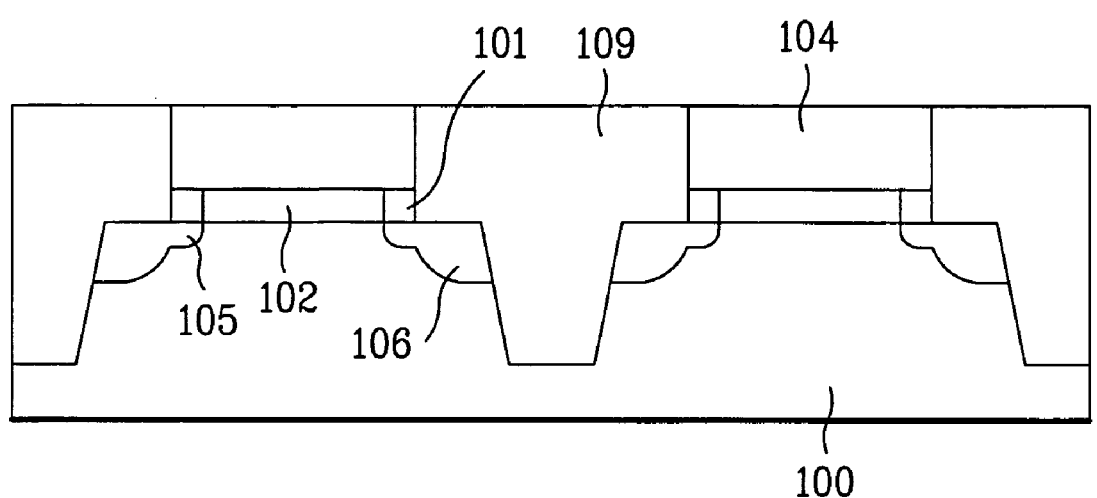
FIG. 2 is a sectional view of a semiconductor device in accordance with an exemplary embodiment of the present invention.

As shown in FIG. 2, a semiconductor device according to an exemplary embodiment of the present invention may comprise an isolating film 109 formed on isolating regions of a semiconductor substrate 100, which is divided into active regions and the isolating regions, a gate insulating film formed at the active regions of the semiconductor substrate 100 and having openings 102 with a designated width, gate electrodes 104 formed on the gate insulating film, and lightly doped drain regions 105 and source/drain impurity regions 106 formed on the surface of the semiconductor substrate 100 at both sides of the gate electrodes 104. The inside of the openings 102 form a vacuum condition, or gas may be injected to the insides of the openings 102.

The gate insulating film has a nitride film 101 at both sides of the openings 102 for maintaining the vacuum condition or the gas injected in the openings 102. The nitride film 101 can have a width on the order of several hundreds to several thousands of angstroms, as necessary to maintain the vacuum condition in the openings 102 or the gas injected into the openings 102.

FIGS. 3A-3F illustrate a method for manufacturing the semiconductor device in accordance with an embodiment of the present invention.

Figure 3A:
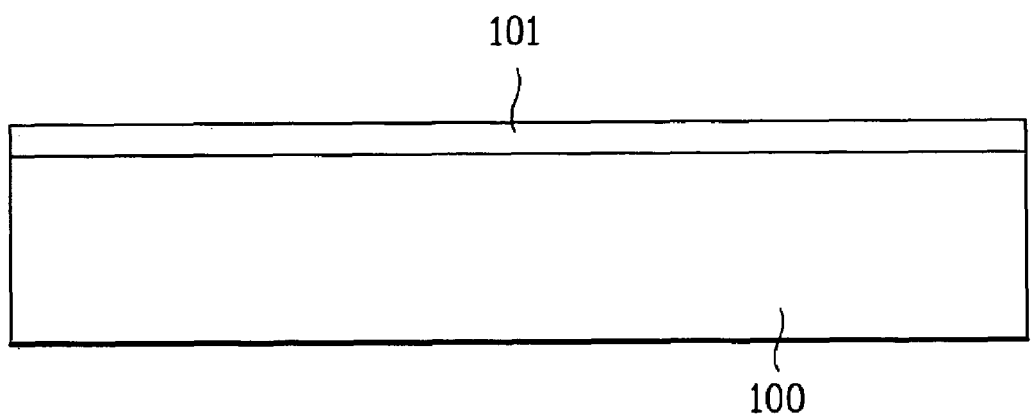
FIGS. 3A-3F are sectional views of a semiconductor device manufactured according to the method of an exemplary embodiment of the present invention.

As shown in FIG. 3A, the nitride film 101 having a thickness of approximately 10-500 Å is formed on the semiconductor substrate 100. Although the exemplary embodiment of the present invention describes the nitride film 101, other insulating films, such as an oxide film, may be formed on the semiconductor substrate 100.

Figure 3B:
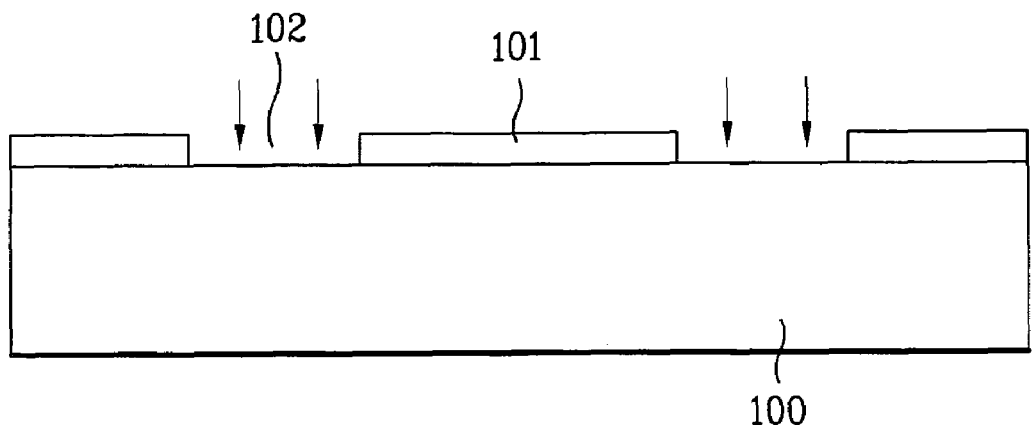

As shown in FIG. 3B, the nitride film 101 is selectively patterned by photolithography processes, thereby forming the openings 102 having a predetermined width. Thereafter, an ion implantation buffer oxide film (not shown) is formed on the surfaces of the semiconductor substrate 100, exposed by the openings 102, and impurity ions for adjusting a threshold voltage are implanted into the semiconductor substrate 100 corresponding to the openings 102. The implanted impurity ions may be used to form stop channels and/or to form wells.

Figure 3C:
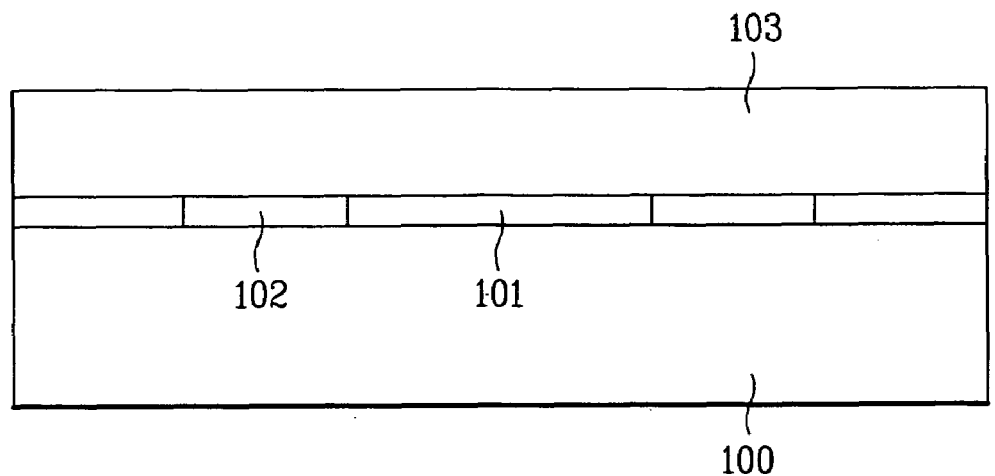

As shown in FIG. 3C, the semiconductor substrate 100 including the nitride film 101 having the openings 102 is loaded in a high-vacuum chamber (not shown), and a subsidiary silicon wafer layer 103 is attached to the semiconductor substrate 100 under a high vacuum condition. To obtain desired permittivity and dielectric strength, the attachment of the subsidiary silicon wafer layer 103 to the semiconductor substrate 100 may be performed in a designated gas atmosphere. The permittivity and the dielectric strength are controlled by adjusting an applied pressure, for example, from several milli-torrs to several thousand milli-torrs. Thereafter, thermal treatment of the semiconductor substrate 100, to which the subsidiary silicon wafer layer 103 is attached, is performed, thereby strengthening the attachment. An unnecessary thickness of the subsidiary silicon wafer layer 103 may be removed by a planarization process such as chemical-mechanical polishing.

Although in an exemplary embodiment of the present invention the subsidiary silicon wafer layer 103 is attached to the semiconductor substrate 100, in the same manner and under the same or similar conditions, a conductive layer for gate electrodes, such as a silicon wafer layer, a polysilicon layer, or a layer obtained by laminating a polysilicon layer and a metal silicide film, may be attached to the semiconductor substrate 100. In fact, the subsidiary silicon wafer layer 103 may be replaced with any conductive layer for gate electrodes. The metal of the metal silicide film is one having a high melting point, such as tungsten, cobalt, titanium, or tantalum.

Figure 3D:
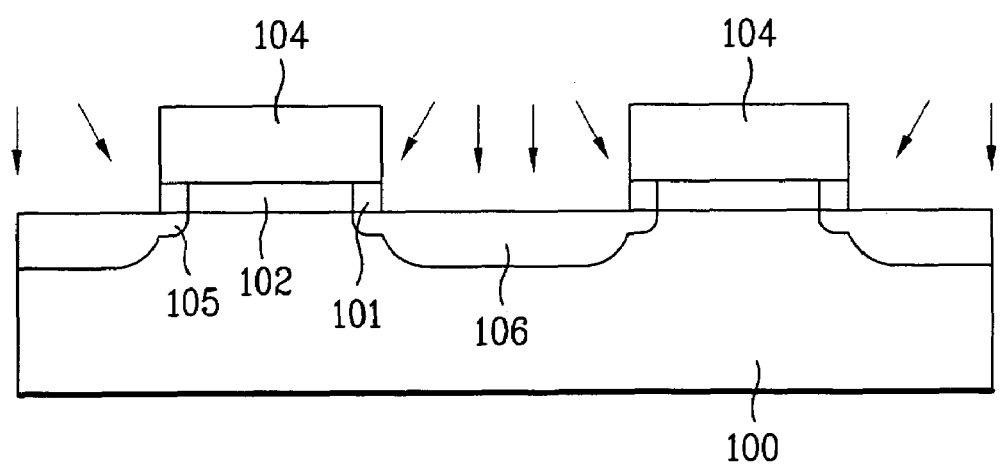

As shown in FIG. 3D, the subsidiary silicon wafer layer 103 and the nitride layer 101 are selectively removed by photolithography, thereby forming gate electrodes 104. The gate electrodes 104 correspond to the openings 102, and the nitride film 101 remains at both sides of the gate electrodes 104 so that the remaining portions of the nitride film 101 have a width on the order of several hundreds to several thousands of angstroms to maintain the vacuum condition in the openings 102 or the gas injected into the openings 102.

N-type or P-type low-concentration impurity ions are implanted into the semiconductor substrate 100 at a designated tilt using the gate electrodes 104 as a mask, thereby forming the lightly doped drain regions 105 in the semiconductor substrate 100. When the low-concentration impurity ions are implanted into the semiconductor substrate 100, the lightly doped drain regions 105 are formed under the nitride film 101 by the tilt. Then, high-concentration impurity ions are implanted into the overall surface of the semiconductor substrate 100, thereby forming the source/drain impurity regions 106 in the semiconductor substrate 100 at both sides of the gate electrodes 104.

Figure 3E:
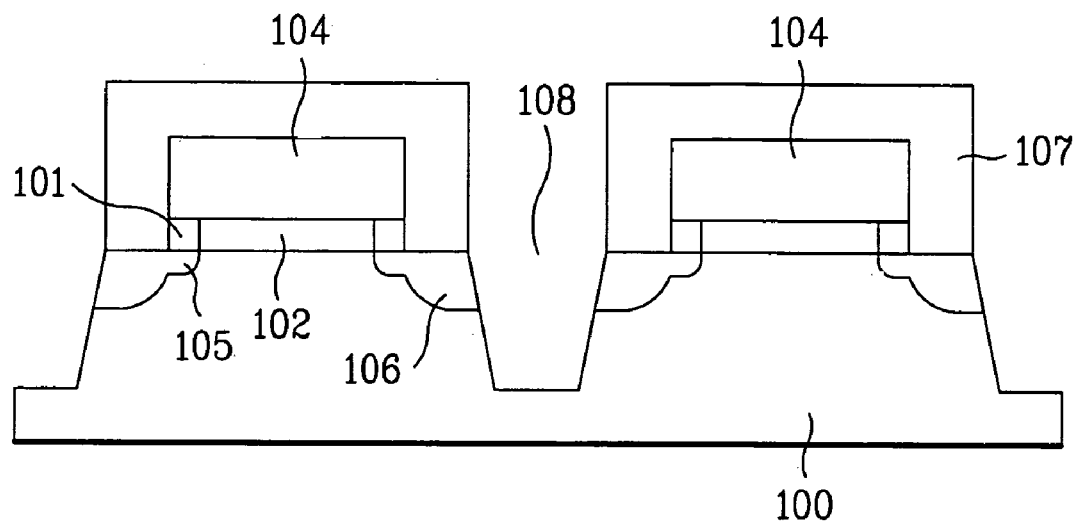

As shown in FIG. 3E, a photoresist 107 is applied to the semiconductor substrate 100, and is patterned by exposure and development processes, thereby defining the element isolating regions. Portions of the semiconductor substrate 100 corresponding to the element isolating regions are selectively etched using the patterned photoresist 107 as a mask, thereby forming trenches 108 having a designated depth from the surface of the semiconductor substrate 100.

Figure 3F:
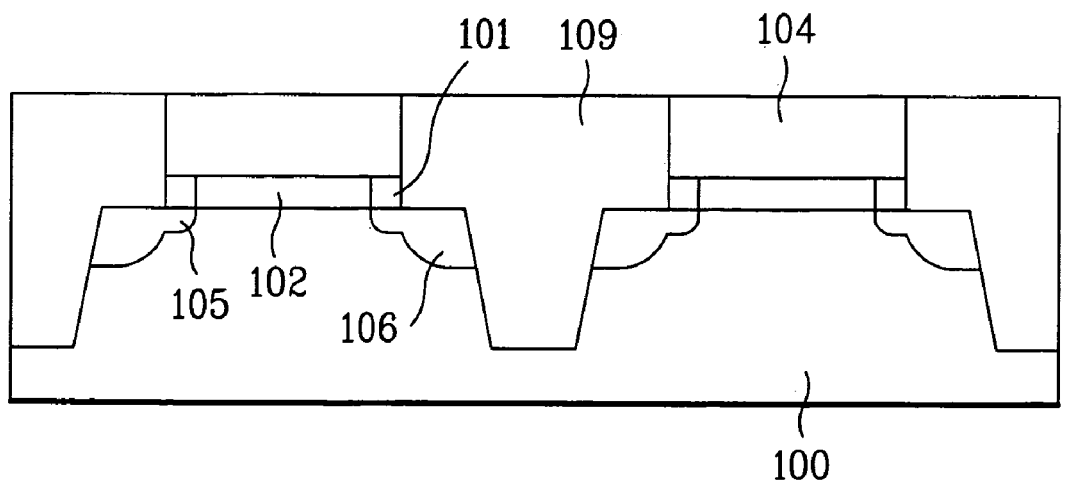

As shown in FIG. 3F, the photoresist 107 is removed. An insulating film for filling gaps, for example, a SOG, USG, or TEOS oxide film, is deposited on the overall surface of the semiconductor substrate 100, and is planarized by chemical-mechanical polishing, thereby forming the element isolating film 109 in the trenches 108 and on the semiconductor substrate 100 adjacent the trenches 108. Thereafter, N-type or P-type impurity ions are implanted into the gate electrodes 104 so that the gate electrodes 104 are conductive.

Accordingly, in the method of the present invention, the gate insulating film is made of the nitride film 101 that define openings 102, while, in the conventional method, a gate insulating film is made of a solid insulating material, such as a gate oxide film. The openings 102 of the gate insulating film are under vacuum condition or are filled with a gas, and the nitride film 101 is present at both sides of the openings 102 for maintaining the vacuum condition in the openings 102 or the gas filling the openings 102. Since the gate insulating film does not employ an oxide film in a solid state and is formed under a vacuum condition, it may be possible to prevent deterioration of reliability of the semiconductor device due to degradation of a gate insulating material, thereby allowing the semiconductor device to have stable operating characteristics.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method for manufacturing a semiconductor device, comprising:

forming an insulating film on a semiconductor substrate;

forming openings having a designated width by selectively etching the insulating film;

attaching a conductive film to the overall surface of the semiconductor substrate including the openings under a vacuum condition;

forming gate electrodes corresponding to the openings and having a width larger than the width of the openings by selectively etching the conductive film and the insulating film;

forming lightly doped drain regions and source/drain impurity regions in the surface of the semiconductor substrate at both sides of the gate electrodes;

forming a mask layer covering portions of the semiconductor substrate having the source/drain impurity regions including the gate electrodes;

forming trenches by selectively etching exposed portions of the semiconductor substrate using the mask layer as a mask; and forming an element isolating film in the trenches and on the semiconductor substrate adjacent the trenches.

2. The method as set forth in claim 1, wherein the insulating film is a nitride film having a thickness of approximately 10-500 Å.

3. The method as set forth in claim 1, wherein the lightly doped drain regions are formed by implanting low-concentration impurity ions into the semiconductor substrate at a designated tilt using the gate electrodes as a mask.

4. The method as set forth in claim 1, wherein the conductive layer is one selected from the group consisting of a silicon wafer layer, a polysilicon layer, a layer obtained by laminating a polysilicon layer and a metal silicide film.

5. The method as set forth in claim 1, further comprising performing planarization for reducing the thickness of the semiconductor substrate after the attachment of the conductive film to the overall surface of the semiconductor substrate.

6. The method as set forth in claim 1, further comprising implanting conductive impurity ions into the gate electrodes.

7. The method as set forth in claim 1, wherein the attachment of the conductive film to the overall surface of the semiconductor substrate is performed in a designated gas atmosphere.

8. The method as set forth in claim 1, further comprising adjusting a pressure applied when the conductive film is attached to the overall surface of the semiconductor substrate.

9. The method as set forth in claim 8, wherein the pressure is several milli-torrs to several thousand milli-torrs.

10. The method as set forth in claim 1, further comprising performing thermal treatment on the semiconductor substrate after the attachment of the conductive film to the overall surface of the semiconductor substrate.

11. The method as set forth in claim 1, wherein forming the gate electrodes comprises leaving portions of the insulating film under the gate electrodes to have a width on the order of several hundreds to several thousands of angstroms.

* * * * *